United States Patent [19]

Temple et al.

[11] Patent Number: 5,473,193
[45] Date of Patent: Dec. 5, 1995

[54] PACKAGE FOR PARALLEL SUBELEMENT SEMICONDUCTOR DEVICES

[75] Inventors: Victor A. K. Temple, Clifton; Donald L. Watrous, Clifton Park, both of N.Y.; Homer H. Glascock, II, Millis, Mass.

[73] Assignee: Harris Corporation, Melbourne, Fla.

[21] Appl. No.: 177,974

[22] Filed: Jan. 6, 1994

[51] Int. Cl.⁶ .................................................. H01L 23/48
[52] U.S. Cl. ........................ 257/690; 257/698; 257/724
[58] Field of Search .................................... 257/690, 723, 257/724, 48, 698, 693, 678

[56] References Cited

U.S. PATENT DOCUMENTS

| 4,007,452 | 2/1977 | Hoff, Jr. | 257/208 |
| 4,984,051 | 1/1991 | Yoshida | 257/690 |

FOREIGN PATENT DOCUMENTS

| 3516995 | 11/1985 | Germany | 257/587 |

OTHER PUBLICATIONS

W. Scot Ruska, Ph.D., Microelectronic Processing, An Introduction to the Manufacture of Integrated Circuits, 1987, pp. 9 & 12.

*Primary Examiner*—William Mintel
*Assistant Examiner*—Peter Toby Brown
*Attorney, Agent, or Firm*—Rogers & Killeen

[57] ABSTRACT

A package for semiconductor devices with plural subelements and method of packaging. Semiconductor power devices may include plural subelements to increase device manufacturing yield. Each subelement is separately contacted through the lid of the package by attaching a foil to a subelement contact and depending a tab from the foil that extends through the lid. Tabs for operative subelements can be connected external to the package, and tabs for inoperative subelements may be left unconnected or covered so that electrical connections cannot be made therewith.

7 Claims, 2 Drawing Sheets

PACKAGE FOR PARALLEL SUBELEMENT SEMICONDUCTOR DEVICES

BACKGROUND OF THE INVENTION

The present invention relates to packages for semiconductor devices, and more particularly to packages and methods of packaging semiconductor devices having plural subelements in which inoperative subelements are not connected to operative subelements.

Some semiconductor devices, particularly power devices, require a large active area to be able to carry the large currents associated with such devices. As is known, current carrying capability is a function of active area size. However, as the size of the active area increases, the yield rate (i.e., the percentage of the devices manufactured that are operative) decreases. In some high power semiconductor devices, the yield rate may be only a few percent. To increase the likelihood that the semiconductor device will be operative, the active area of the device may be divided into smaller subelements with higher yield rates, each subelement having an active area that may be selectively connected in parallel to other subelement active areas to create an active area of requisite size. While not all subelements will be operative (typically, the yield rate does not reach 100%), the number of subelements can be selected so that, on average, the number of subelements available will meet the device's current rating.

By way of example, and with reference to FIG. 1, a semiconductor device 10 requiring four units of active area to achieve its current rating may include six subelements 12, each with a yield rate of about 70% and an active area of one unit (the subelement boundaries are indicated by the dashed lines in FIG. 1). The likelihood that four or more subelements will be operative is far better than the yield rate for a device with a single active area of four units. The subelements may each include an active area 16 and a gate 18 and may be separated from the edge of the device by a termination region 14. The active areas 16 are desirably separated from each other in the silicon substrate so that inoperative subelements do not interfere with the operation of operative subelements. The distance between active areas may be reduced to save space on the device by reducing the carrier diffusion length between active areas, such as by reducing local carrier lifetimes.

The manufacture of semiconductor devices with plural subelements has presented new problems and the present invention is directed, at least in part, to solving some of those problems. For example, electrical contacts are to be made to operative subelements, but should not be made to inoperative subelements; how and when in the manufacturing process are the subelements tested; where the electrical connections should be located among operative subelements; how to make the electrical connections to the operative subelements through the package for the device?

Accordingly, it is an object of the present invention to provide a novel package for a semiconductor device with plural subelements and a novel method of packaging such a device in which operative subelements are electrically connected, while inoperative subelements are not.

It is another object of the present invention to provide a novel package for a semiconductor device with plural subelements and a novel method of packaging such a device in which the electrical connections to operative subelements are made after the device has been packaged and on top of the lid for the package.

It is still another object of the present invention to provide a novel package for a semiconductor device with plural subelements and a novel method of packaging such a device in which the active area and the gate for each subelement are contacted separately through the lid of the package for the device.

It is yet another object of the present invention to provide a novel package for a semiconductor device with plural subelements and a novel method of packaging such a device in which a contact for a subelement gate is bonded to the gate pad without decreasing the size of the active area of the subelement.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
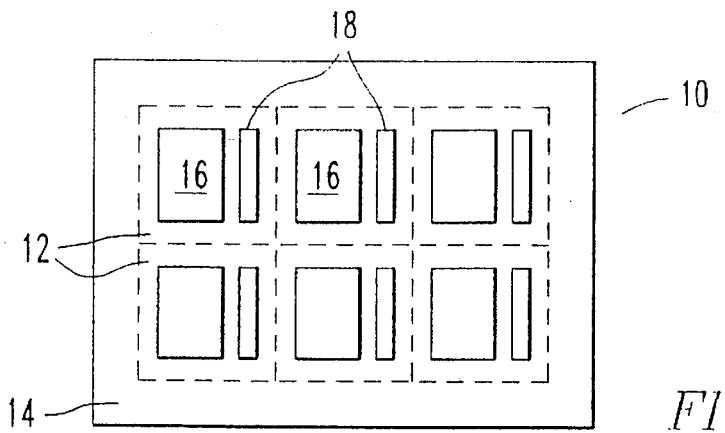
FIG. 1 is a pictorial representation of a top plan view of a semiconductor device with subelements.
Figure 2:
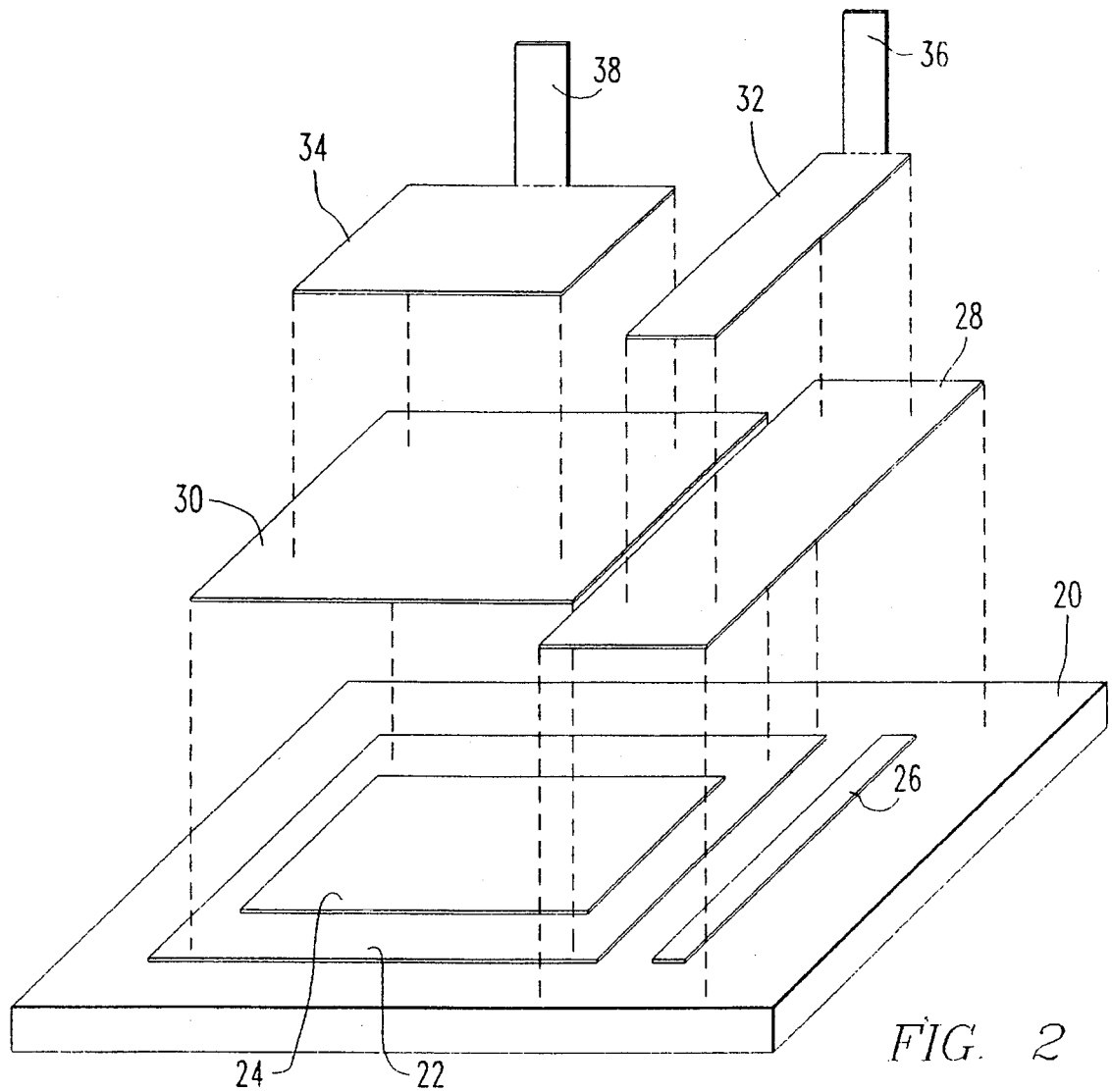
FIG. 2 is an exploded pictorial representation of an embodiment of the present invention illustrating a single subelement in the interest of clarity.

With reference now to FIG. 2, an embodiment of the present invention may be seen as applied to a single subelement 20 having an active area 22 with a contact pad 24, and a gate contact pad 26. Other subelements 20 have been omitted in the interest of clarity, with those of skill in the art understanding that the embodiment illustrated in FIG. 2 is applicable to semiconductor devices with a plurality of subelements (e.g., devices with twenty-five subelements have been manufactured using the present invention). Further, it will be understood that the depiction of the subelement 20 having a gate and an active area (typically an anode or cathode terminal in power devices, such as MOS gated bipolar devices) is not limiting as the invention is also applicable to other types of semiconductor devices in which operating portions of the device may be divided into subelements. The invention can also be used to contact the opposite terminal in the device.

Metal sheets 28 and 30 may be attached to the contact pads 26 and 24, and metal foils 32 and 34 may be attached thereto, with each of the foils 32 and 34 having a tab 36 and 38 depending therefrom and extending away from the surface of the subelement 20. The sheets and foils may be conventional materials, such as copper, nickel and aluminum, and may be attached using conventional techniques, such as bonding, soldering, etc., with bonding being preferred. The sheet 28 attached to the gate contact pad 26 is desirably larger than the pad 26 so that the foil 32 may be attached (thereby completing electrical connection from the tab 36 to pad 26). A contact pad for the gate is needed, but takes up space in the subelement that may be used for active area, and accordingly is desirably as small as possible while having sufficient space for attachment of a contact thereto. The presence of sheet 28 precludes the need to increase gate contact pad size. The sheet 28 may overlie other parts of the subelement, including the active area 22, and may be separated therefrom with appropriate insulation. Further, the tabs 36 and 38 are desirably large enough to allow connection to circuits in which the semiconductor device may operate.

Figure 3:
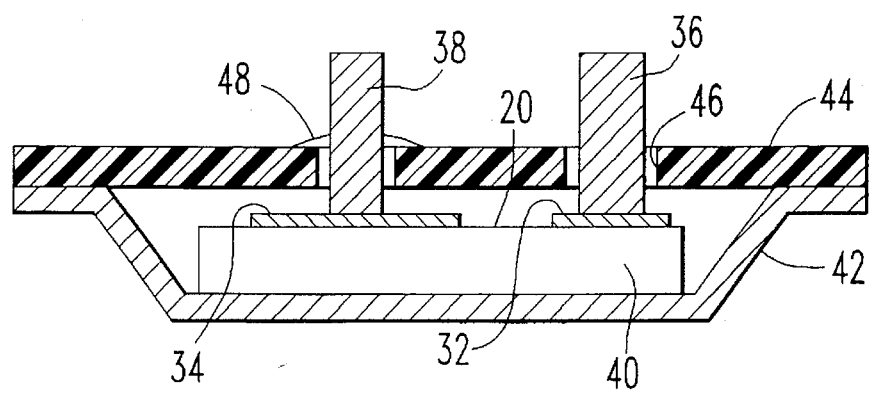
FIG. 3 is a vertical cross section of an embodiment of the present invention illustrating a single subelement in the interest of clarity.

With reference now to FIG. 3, the semiconductor device 40 with subelement 20 (again only one of the subelements is shown in the interest of clarity) may be packaged in a cup 42 with a lid 44. Tabs 36 and 38 extend through openings 46 in the lid 44 so that they may be connected as appropriate. The cup 42 and lid 44 may be conventional and attached in manners other than that shown. The lid may be a ceramic that is direct bonded copper (DBC) to a metal cup in a hermetic or non-hermetic package, or the lid may be bonded to the cup using diffusion bonding after suitable metalization of the bonding surfaces. The lid also may be a plastic encapsulation material that fills the cup, or the lid may be attached directly to the substrate for the semiconductor device by extending the edge of the substrate to provide a bonding surface, obviating the need for a cup. Seals 48 may be provided as needed to close the openings 46.

Figure 4:
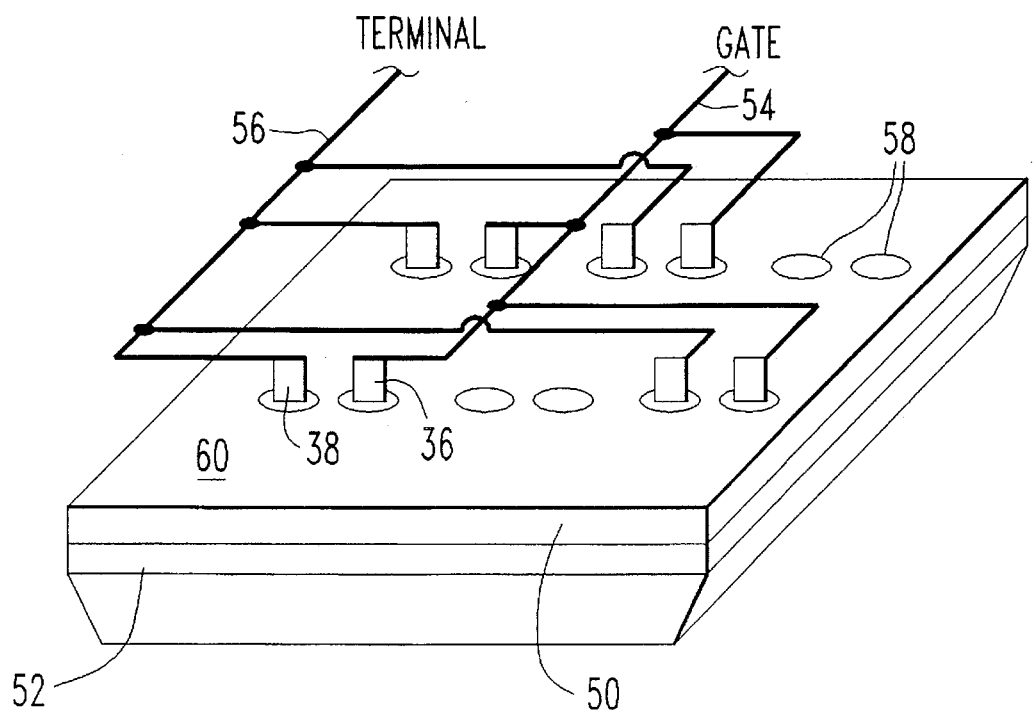
FIG. 4 is a pictorial representation of a packaged device of the present invention illustrating the subelement contacts extending through the lid of the package.

With reference now to FIG. 4, in which a lid 50 for a semiconductor device with six subelements in a cup 52 may be seen, the tabs 36 and 38 of operative subelements may extend above the lid 50 so that they may be contacted as needed, such as depicted by the gate contact circuit 54 and device terminal circuit 56. The tabs of inoperative subelements (two in the example of FIG. 4) may be covered or sealed with appropriate material 58 so that they cannot be electrically contacted. The length of tabs of inoperative subelements may be reduced, such as by cutting, so that they do not extend above the surface 60 of the lid 50. Alternatively, the tabs of inoperative elements may extend above the surface 60 and be left unconnected and/or marked to alert the manufacturer or user.

In an alternative embodiment of the present invention, the sheets 28 and 30 (illustrated in FIG. 2) may be omitted, although the size of the foil 32 and tab 36 must be commensurately reduced if active area size is to be maintained. In another alternative embodiment, the sheet 30 may be omitted and the foil 34 may be attached directly to the contact pad 24.

In an embodiment of the method of the present invention, the determination that a subelement is operative may be made at an appropriate step in the manufacture of the device. In a preferred embodiment, subelement testing proceeds after device manufacture is complete.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A package for a semiconductor device having a plurality of subelements on a substrate, each of the subelements having a gate and a terminal and a contact for each gate and terminal that is to be electrically connected to corresponding contacts of other subelements, with inoperative subelements not being electrically connected, the package comprising:

a plurality of conductive foils, one for each of the contacts, each of said foils being attached to its respective one of said contacts in an electrically conductive relationship;

each of said foils having a contact pin depending therefrom;

a lid for covering the plurality of subelements, said lid having a plurality of openings, one for each said contact pin; and a seal for each of said openings, said seal surrounding each said contact pin that is associated with an operative subelement so that electrical contact can be made therewith, and said seal covering each said contact pin that is associated with an inoperative subelement so that electrical connections cannot be made thereto.

2. The package of claim 1 wherein each said contact pin that is associated with an inoperative subelement is shortened so that it does not extend through said lid, and each said contact pin that is associated with an operative subelement extends through said lid.

3. The package of claim 1 further comprising a plurality of electrically conductive sheets, one for each of the gate contacts, that are each substantially larger than their respective gate contacts, and that are bonded to the gate contacts and to said foils.

4. The package of claim 1 further comprising a cup for holding the substrate and to which said lid is bonded.

5. A package for a semiconductor device having a plurality of subelements covered with a lid, each of the operative ones of the subelements having plural electrical contact pads that are to be electrically connected to corresponding pads of other subelements, with inoperative ones of the subelements having plural electrical contact pads that are not being electrically connected, the package comprising:

first foils that each have a tab that extends through the lid and that are each connected to a pad of an operative subelement;

electrical connections among operative subelements contacting said extended portion of said first contact pins;

second foils that are each associated with a pad for an inoperative subelement and to which electrical connections are not made; and a plurality of electrically conductive sheets, one for each of the contact pads, that are each bonded to a contact pad and to its respective one of said first and second foils.

6. The package of claim 5 wherein the semiconductor device is a MOS gated power device with at least six subelements, and wherein the contact pads comprise a gate contact and an emitter contact for each subelement.

7. The package of claim 5 wherein said sheets are each larger than their respective contact pads.

* * * * *